(12) United States Patent
Entsfellner et al.

(10) Patent No.: US 9,396,885 B2
(45) Date of Patent: Jul. 19, 2016

(54) SWITCH

(71) Applicant: ROSENBERGER HOCHFREQUENZTECHNIK GMBH & CO. KG, Fridolfing (DE)

(72) Inventors: Christian Entsfellner, Fridolfing (DE); Thomas Müller, Berchtesgaden (DE)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 14/408,484

(22) PCT Filed: Jun. 4, 2013

(86) PCT No.: PCT/EP2013/001635
§ 371 (c)(1),
(2) Date: Dec. 16, 2014

(87) PCT Pub. No.: WO2013/189570
PCT Pub. Date: Dec. 27, 2013

(65) Prior Publication Data
US 2015/0155109 A1   Jun. 4, 2015

(30) Foreign Application Priority Data

Jun. 18, 2012 (DE) .................... 20 2012 005 934 U

(51) Int. Cl.
| | |
|---|---|
| *H01H 1/04* | (2006.01) |
| *H01H 1/021* | (2006.01) |
| *G01R 1/20* | (2006.01) |
| *H01H 1/20* | (2006.01) |
| *H01H 1/14* | (2006.01) |
| *H01P 1/10* | (2006.01) |

(52) U.S. Cl.
CPC ............... *H01H 1/021* (2013.01); *G01R 1/206* (2013.01); *H01H 1/14* (2013.01); *H01H 1/20* (2013.01)

(58) Field of Classification Search
CPC .............. H01P 1/10; H01P 1/125; H01H 1/06
USPC ......... 333/101, 262, 105; 200/51.04, 275, 283
See application file for complete search history.

(56) References Cited

U.S. PATENT DOCUMENTS

| | | | | |
|---|---|---|---|---|
| 5,247,267 A | * | 9/1993 | Yee | H01P 1/125 174/16.3 |
| 5,619,061 A | * | 4/1997 | Goldsmith | H01G 5/16 257/415 |
| 6,043,440 A | * | 3/2000 | Sun | H01H 1/2016 200/16 R |
| 6,046,659 A | * | 4/2000 | Loo | B81B 3/0072 200/181 |
| 6,366,186 B1 | * | 4/2002 | Hill | H01H 50/005 257/421 |

(Continued)

FOREIGN PATENT DOCUMENTS

EP     1675148 A1    6/2006

*Primary Examiner* — Dean Takaoka
(74) *Attorney, Agent, or Firm* — DeLio, Peterson & Curcio, LLC; Robert Curcio

(57) ABSTRACT

A switch for electrically connecting at least two lines as and when required, having a housing having at least two terminals for the lines to be connected to, having a first conductor connected to a first terminal and a second conductor connected to a second terminal and having a connecting conductor which can be brought into contact with the two conductors by an actuating device in order to close the switch, wherein at least one of the conductors and the connecting conductor are in contact indirectly via a dielectric when the switch is in the closed state.

15 Claims, 1 Drawing Sheet

(56) References Cited

U.S. PATENT DOCUMENTS

| | | | |
|---|---|---|---|
| 6,650,210 B1 * | 11/2003 | Raklyar | H01P 1/125 200/504 |
| 6,713,695 B2 * | 3/2004 | Kawai | H01H 59/0009 200/181 |
| 6,856,212 B2 * | 2/2005 | Kwiatkowski | H01H 1/06 333/105 |
| 8,008,588 B2 * | 8/2011 | Kaida | H01H 3/16 200/238 |
| 2002/0140533 A1 | 10/2002 | Miyazaki et al. | |
| 2004/0005871 A1 | 1/2004 | Saito et al. | |
| 2004/0160726 A1 | 8/2004 | Lerche et al. | |

* cited by examiner

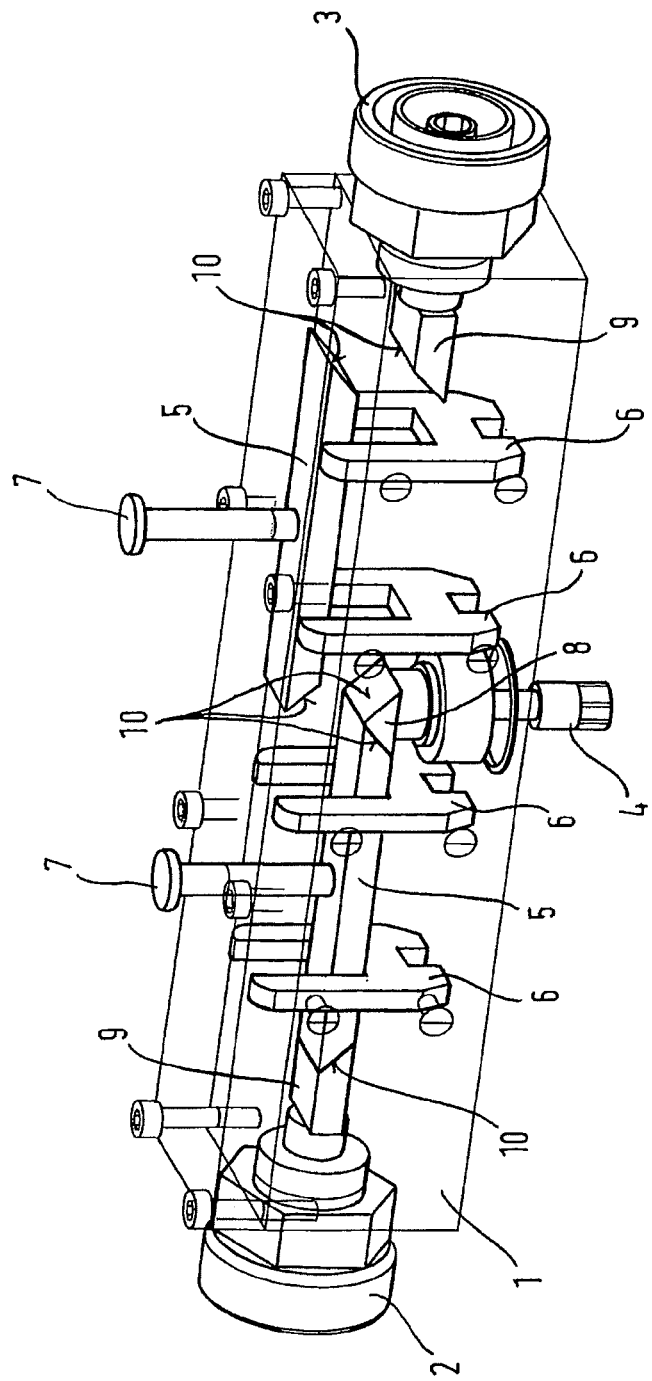

SWITCH

BACKGROUND OF THE INVENTION

Field of the Invention

The invention relates to a switch for electrically connecting at least two lines as and when required, and in particular to a switch by which at least two electronic components connected to the lines are connected together temporarily for the transmission of radio-frequency signals. One of the electronic components may in particular be an intermodulation meter with which intermodulation of the radio-frequency signals generated by the other electronic component is to be tested. It will be clear that for this purpose it is necessary, if possible, for the switch itself not to cause any intermodulation of the radio-frequency signals so that the resulting measurement is not falsified.

SUMMARY OF THE INVENTION

The object underlying the present invention is to specify a switch which is improved in respect of its intermodulation characteristics.

This object is achieved by a switch as defined herein and in the claims. Advantageous embodiments of the switch according to the invention form the subject matter of the claims and can be seen from the following description of the invention. Also, a switch unit having at least two switches according to the invention forms the subject matter of ancillary claims.

The above and other objects, which will be apparent to those skilled in the art, are achieved in the present invention which is directed to a switch for electrically connecting at least two lines including: a housing having at least two terminals for the lines to be connected to, with a first conductor connected to a first terminal, and a second conductor connected to a second terminal, and a connecting conductor in releasable electrical communication with the two conductors by an actuating device in order to close the switch, at least one of the conductors and the connecting conductor being in contact indirectly via a dielectric when the switch is in the closed state, wherein the connecting conductor is movable in translation by the actuating device.

The dielectric is preferably a layer of a thickness of approximately ≤0.1 mm, and may be based on a polyimide, Teflon or Kapton.

Contact-making surfaces of the two conductors and the connecting conductor may be of an oblique form relative to the longitudinal axis of the associated conductor or connecting conductor, and may be in opposite directions.

The connecting conductor is preferably loaded into its open position by a resilient member, wherein the terminals, the conductors, and the connecting conductor preferably have an impedance of 50Ω.

In a second aspect, the present invention is directed to a switch unit for electrically connecting lines, the switch unit having two switches, there being three terminals and three conductors connected thereto plus two connecting conductors, each switch including a housing having at least two terminals for the lines to be connected to, having with a first conductor connected to a first terminal, and a second conductor connected to a second terminal, and having a connecting conductor which can be brought into contact in releasable electrical communication with the two conductors by means of an actuating device in order to close the switch, at least one of the conductors and the connecting conductor being in contact indirectly via a dielectric when the switch is in the closed state, wherein the connecting conductor is movable in translation by means of the actuating device.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 is an isometric view of a switch unit according to the invention.

DESCRIPTION OF THE PREFERRED EMBODIMENT(S)

In describing the preferred embodiment of the present invention, reference will be made herein to FIG. 1 of the drawings in which like numerals refer to like features of the invention.

A switch of the generic kind for electrically connecting at least two lines as and when required which has a housing having at least two terminals for the lines to be connected to, a first conductor connected to a first one of the terminals, a second conductor connected to a second one of the terminals and a (or at least one) connecting conductor which can be brought into contact with the two conductors as and when required by an actuating device is characterized in accordance with the invention in that at least one, and preferably all, of the conductors is/are in contact with the connecting conductor indirectly via a dielectric when the switch is in the closed state.

Because of the dielectric isolation of the conductors which are intended particularly for the transmission of radio-frequency signals, transmission of these latter can take place with only low intermodulation or possibly even largely free of any intermodulation.

The dielectric is preferably a layer which is provided on at least one, and preferably both, of the contact-making surfaces forming the relevant pair of contact-making surfaces (conductor and connecting conductor).

The thickness of the layer is preferably ≤0.1 mm.

Furthermore, provision may preferably be made for the dielectric to be based on a polyimide, Teflon or Kapton and in particular for it to take the form of a polyimide film.

In an embodiment of switch according to the invention which is also preferred, provision may be made for contact-making surfaces of the two conductors and the connecting conductor to be of an oblique form relative to the longitudinal axes of the conductor or connecting conductor concerned. In this way, the contact-making surfaces can be formed to be relatively large in comparison with the cross-sectional area of the conductor or connecting conductor, whereby a relatively low transmission loss can, in particular, be achieved for radio-frequency signals carried by the conductors or connecting conductor.

A particular preference in this case is for provision to be made for both the contact-making surfaces of the two conductors and the contact-making surfaces of the connecting conductor to be of an oblique form in opposite respective directions. This enables the two conductors to form a tapering receiving space in which the connecting conductor, which tapers in a corresponding way, can be received in positive inter-engagement. The receiving space thereby forms a stop for the connecting conductor (and an end position for an actuating movement) when the connecting conductor is actuated by the actuating device.

Another preferred embodiment of switch according to the invention makes provision for the connecting conductor to be designed to be movable purely in translation by the actuating device, whereby a structurally simple and rugged design can be produced for the switch according to the invention.

Provision is preferably also made for the switch to be open when the actuating device is not actuated. This can preferably be achieved by having the connecting conductor loaded into its open position by a resilient member.

In a particularly preferred embodiment of switch according to the invention, provision may be made for at least two switches according to the invention to be combined into a switch unit, this latter comprising in the housing three terminals and three conductors connected thereto plus two connecting conductors. Contact is therefore made with one of the conductors by both the connecting conductors. A switch unit of this kind is particularly suitable for carrying out two different tests on a single electronic component, with the electronic component to be tested being connected to that terminal whose conductor is able to make contact as and when required with both the connecting conductors.

The switch unit shown in FIG. 1 comprises two switches according to the invention which are incorporated into a common housing 1. The housing 1 has for this purpose a total of three terminals 2, 3, 4 of which a first one (2) and a second one (3) are arranged at respective ones of the two end-faces and a third one (4) is arranged on one of the longitudinal sides of the housing 1. The third terminal 4 arranged on the longitudinal side is used to connect in a line which is connected to an electronic component to be tested. Two measuring devices may be connected to the two terminals 2, 3 arranged at the end-faces and these two measuring devices may for example be a network analyzer and an intermodulation distortion meter.

To carry out measurements, the two measuring devices can be connected by the switch unit to the electronic component to be tested, as and when required. This is preferably done by two switches according to the invention which are incorporated into the switch unit and through which, when in the closed state, radio-frequency signals generated by the electronic component to be tested are then passed.

Each of these switches comprises a connecting conductor 5 which takes the form of a rigid conductor member of rectangular cross-section. The connecting conductors 5 are each mounted to be displaceable in translation in two guides 6, in which case a movement of the connecting conductors 5 can be brought about by the actuation of an actuating device in the form of an actuating button 7. By the exertion of a compressive force on the actuating button 7 of one of the connecting conductors 5, this latter is displaced in the two associated guides 6 in opposition to the force set up by a resilient member (not shown) until the connecting conductor 5 comes into contact with two conductors 8, 9 of which a first one (8) is connected (to conduct electrically) to that terminal 4 which is arranged on the side face of the housing 1 and of which the second one (9) is connected to that terminal 2, 3 arranged in an end-face which is associated with whichever switch is involved. The conductors 8, 9 (or at least a portion or portions thereof) also take the form of rigid conductor members of rectangular cross-section.

The contact between the connecting conductors 5 (which are formed of electrically conductive material) and the conductors 8, 9 (which are formed of electrically conductive material) is not direct but, in accordance with the invention, takes place indirectly via dielectrics which take the form of polyimide films on each of the contact-making surfaces 10 of the conductors 8, 9 and the connecting conductors 5. Because of the indirect contact of the conductors 8, 9 with the connecting conductors 5, the transmission of the radio-frequency signals takes place effectively via two capacitances and, as a result, is largely free of intermodulation.

To further improve the suitability of the switch unit according to the invention for transmitting radio-frequency signals, provision is made for all the components intended for transmitting radio-frequency signals, i.e. particularly the three terminals 2, 3, 4, the three conductors 8, 9 and the two connecting conductors 5, to be formed to have respective impedances of 50Ω. This is done by making a suitable choice of the individual material in combination with the associated geometry of the given component, and particularly its cross-sectional geometry.

What is more, the contact-making surfaces 10 of the conductors 8, 9 and the connecting conductors 5, which make contact when the switches are in the closed state, are of an oblique form relative to the longitudinal axes of the components concerned. What can be achieved in this way is that the contact-making surfaces 10 are relatively large in comparison with the cross-sectional area of the component concerned, whereby a relatively low transmission loss can be achieved.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A switch for electrically connecting at least two lines including: a housing having at least two terminals for the lines to be connected to, with a first conductor connected to a first terminal, and a second conductor connected to a second terminal, and a connecting conductor in releasable electrical communication with the two conductors by an actuating device in the form of an actuating button in order to close the switch, at least one of the conductors and the connecting conductor being in contact not directly, but indirectly via a dielectric when the switch is in the closed state, wherein the connecting conductor is movable in translation by the exertion of a compressive force on the actuating button.

2. The switch of claim 1 wherein the dielectric is a layer of a thickness of ≤0.1 mm.

3. The switch of claim 2 wherein the dielectric is based on a polyimide, Teflon or Kapton.

4. The switch of claim 2, wherein contact-making surfaces of the two conductors and the connecting conductor are of an oblique form relative to the longitudinal axis of the associated conductor or connecting conductor.

5. The switch of claim 3, wherein contact-making surfaces of the two conductors and the connecting conductor are of an oblique form relative to the longitudinal axis of the associated conductor or connecting conductor.

6. The switch of claim 5 wherein the connecting conductor is loaded into its open position by a resilient member.

7. The switch of claim 6, wherein the terminals, the conductors and the connecting conductor have an impedance of 50Ω.

8. The switch of claim 1, wherein the dielectric is based on a polyimide, Teflon or Kapton.

9. The switch of claim 8 wherein the connecting conductor is loaded into its open position by a resilient member.

10. The switch of claim 8, wherein the terminals, the conductors and the connecting conductor have an impedance of 50Ω.

11. The switch of claim 1, wherein contact-making surfaces of the two conductors and the connecting conductor are of an oblique form relative to the longitudinal axis of the associated conductor or connecting conductor.

12. The switch of claim 11, including both the contact-making surfaces of the conductors and the contact-making surfaces of the connecting conductor are of an oblique form in opposite directions.

13. The switch of claim 1 wherein the connecting conductor is loaded into its open position by a resilient member.

14. The switch of claim 1, wherein the terminals, the conductors and the connecting conductor have an impedance of 50Ω.

15. A switch unit for electrically connecting lines, said switch unit having two switches, there being three terminals and three conductors connected thereto plus two connecting conductors, each switch including a housing having at least two terminals for the lines to be connected to, having with a first conductor connected to a first terminal, and a second conductor connected to a second terminal, and having a connecting conductor which can be brought into contact in releasable electrical communication with the two conductors by means of an actuating button in order to close the switch, at least one of the conductors and the connecting conductor being in contact not directly, but indirectly via a dielectric when the switch is in the closed state, wherein the connecting conductor is movable in translation by exertion of a compressive force on the actuating button.

* * * * *